(12) United States Patent
Chen et al.

(10) Patent No.: US 7,547,571 B2
(45) Date of Patent: Jun. 16, 2009

(54) PACKAGING METHOD OF A LIGHT-SENSING SEMICONDUCTOR DEVICE AND PACKAGING STRUCTURE THEREOF

(75) Inventors: Po-Hung Chen, Chu-Tung (TW); Mao-Jung Chen, Chu-Tung (TW)

(73) Assignee: Sigurd Microelectronics Corp., Shin-Chu (TW)

( * ) Notice: Subject to any disclaimer, the term of this patent is extended or adjusted under 35 U.S.C. 154(b) by 0 days.

(21) Appl. No.: 12/078,819

(22) Filed: Apr. 7, 2008

(65) Prior Publication Data
US 2008/0188031 A1    Aug. 7, 2008

Related U.S. Application Data

(62) Division of application No. 11/239,028, filed on Sep. 30, 2005, now abandoned.

(51) Int. Cl.
*H01L 21/00* (2006.01)
(52) U.S. Cl. ............. 438/64; 257/E21.499; 257/E31.11

(58) Field of Classification Search .................... 438/64
See application file for complete search history.

(56) References Cited

U.S. PATENT DOCUMENTS

| 6,057,597 A * | 5/2000 | Farnworth et al. | 257/710 |
| 6,777,767 B2 * | 8/2004 | Badehi | 257/432 |
| 7,378,724 B2 * | 5/2008 | Yu et al. | 257/685 |

* cited by examiner

*Primary Examiner*—David A Zarneke
(74) *Attorney, Agent, or Firm*—Rosenberg, Klein & Lee

(57) ABSTRACT

The present invention discloses a packaging method of a light-sensing semiconductor device and a packaging structure thereof, wherein a matrix of spacer walls is formed on a light-sensing wafer, which has multiple light-sensing chips, and the adhesive is directly applied to between two neighboring spacer walls on the non-light-sensing regions. Thus, when the light transparent cover is installed, there is no more adhesive dropping onto the light-sensing regions of the light-sensing chips. Further, when the light transparent cover is pressed to join with the spacer walls, with the trenches formed at the tops of the spacer walls, the adhesive will not overflow from the joint seams into the light-sensing regions.

4 Claims, 6 Drawing Sheets

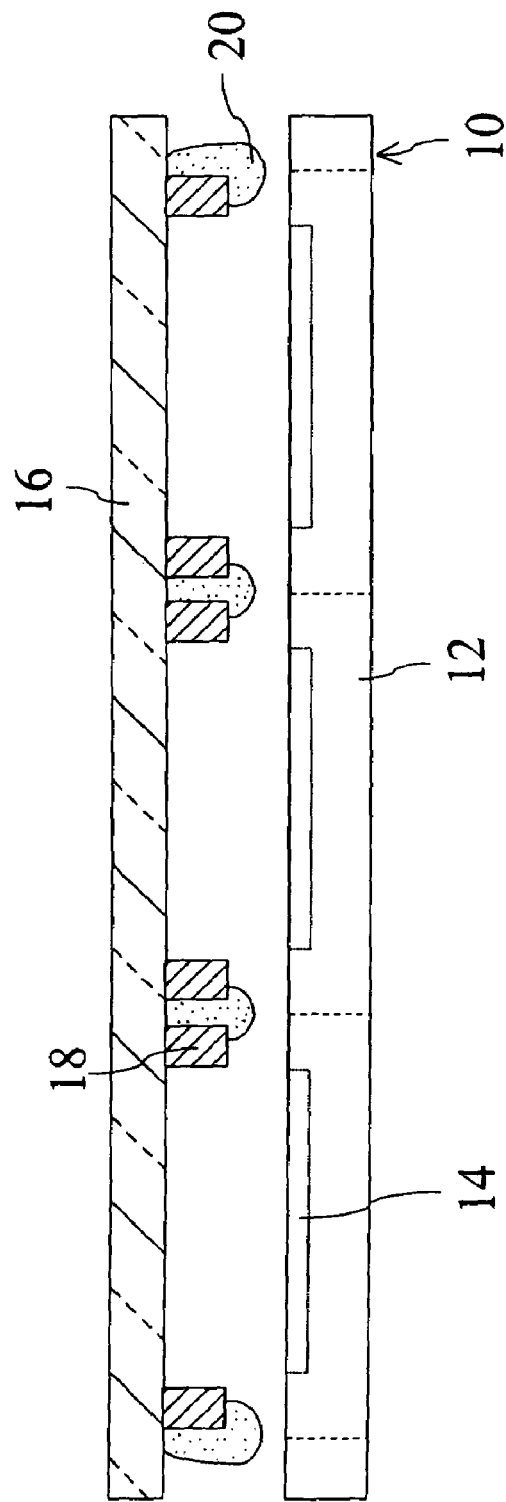
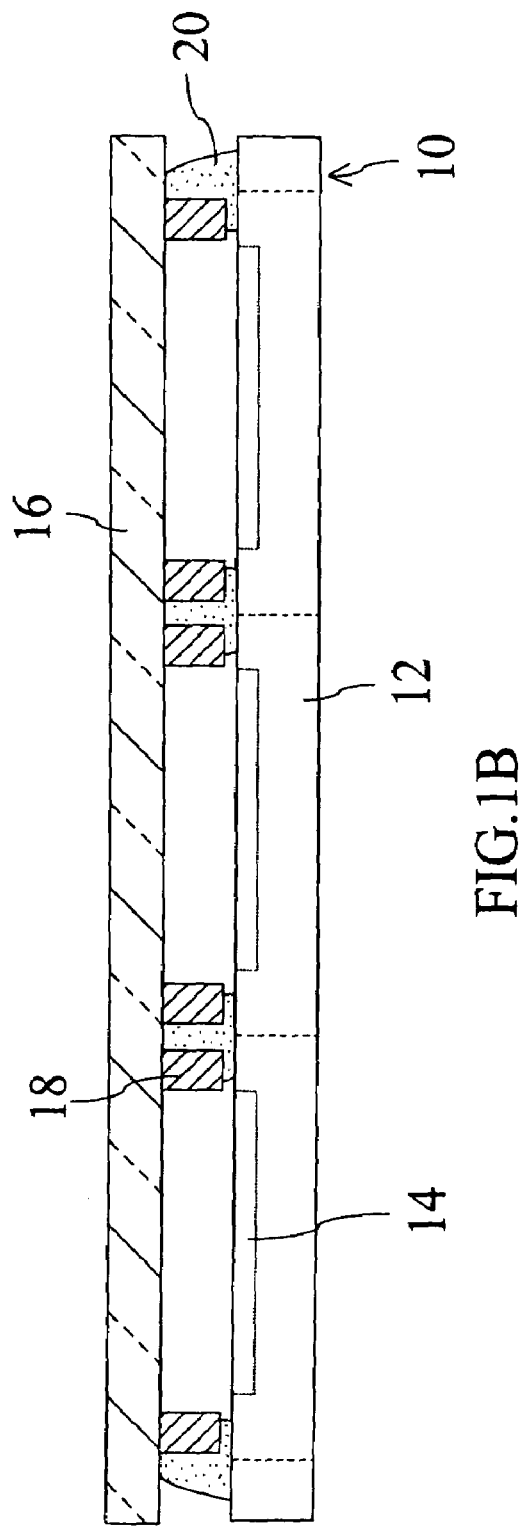
FIG.1A
FIG.1B

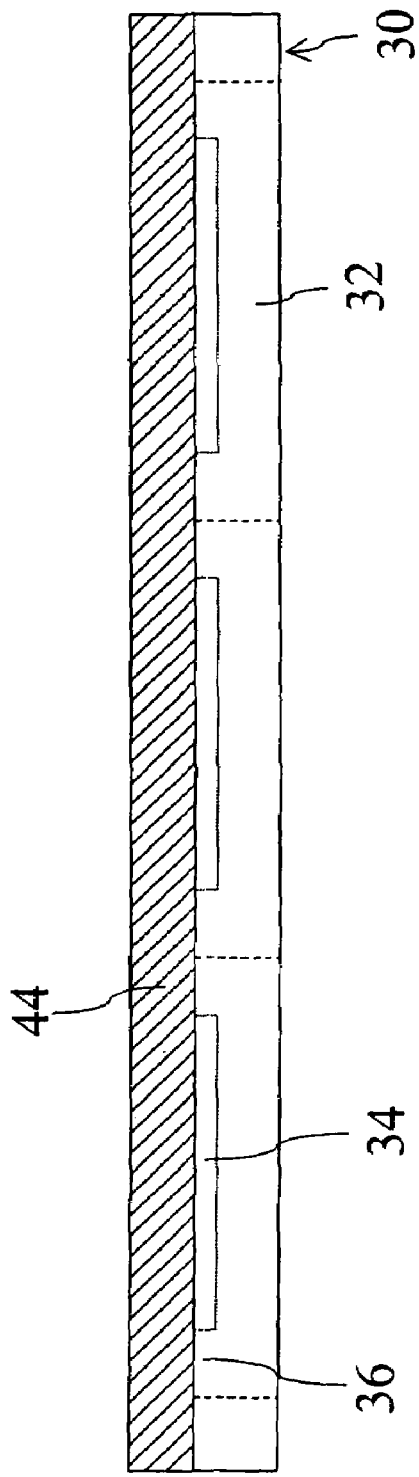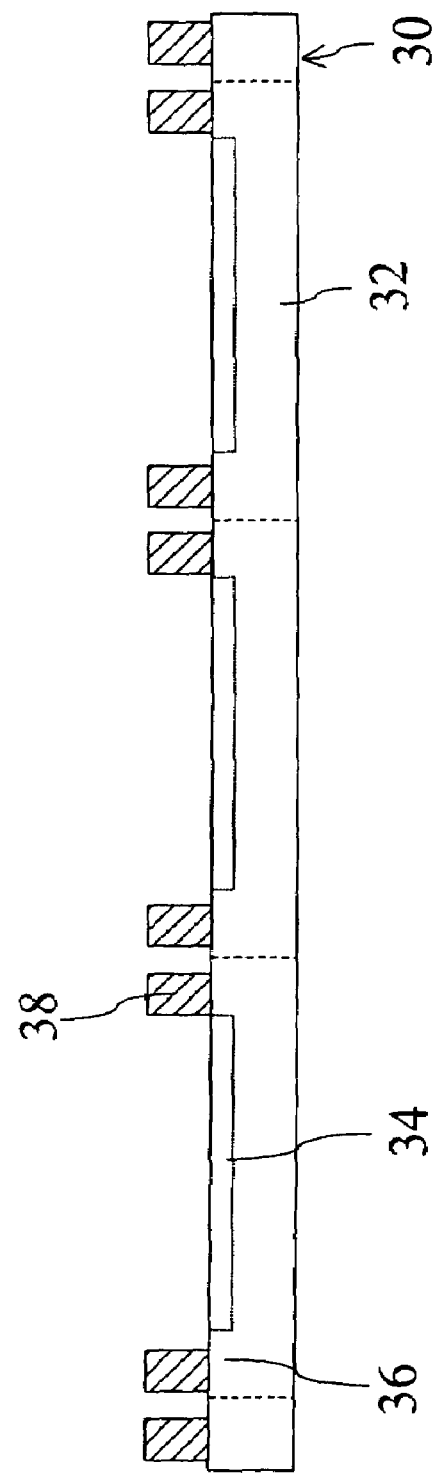
FIG.3A
FIG.3B

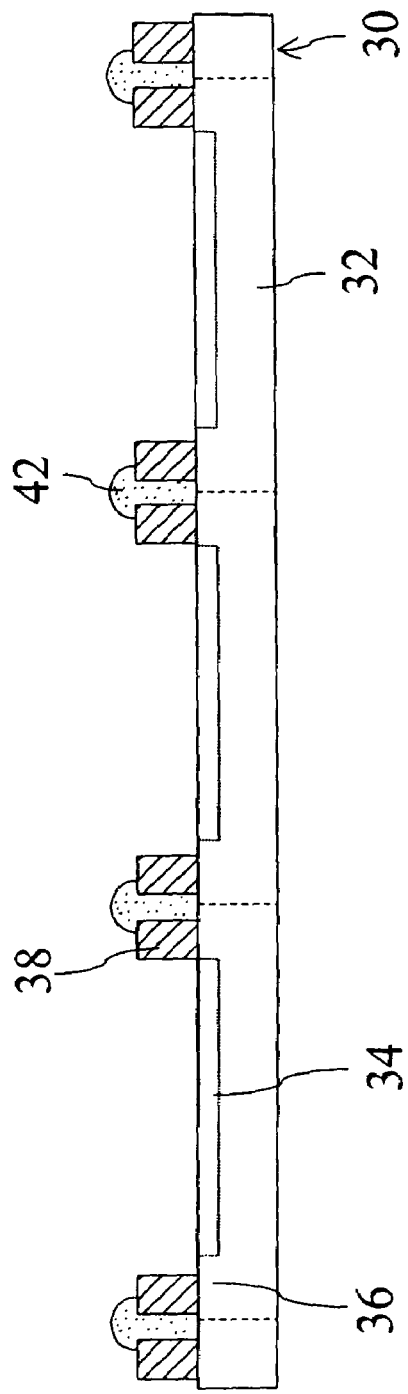
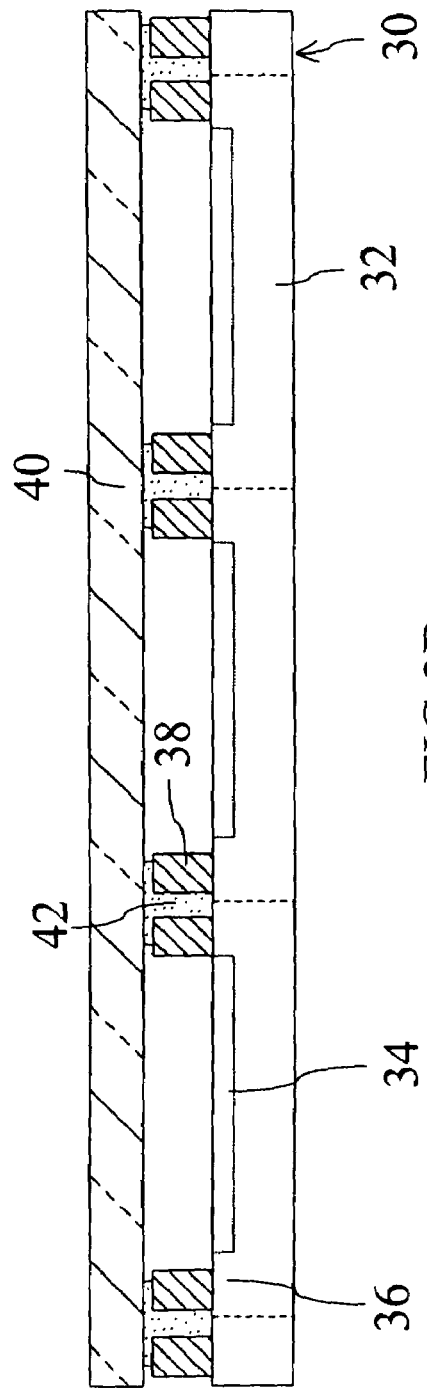
FIG.3C
FIG.3D

PACKAGING METHOD OF A LIGHT-SENSING SEMICONDUCTOR DEVICE AND PACKAGING STRUCTURE THEREOF

RELATED APPLICATIONS

This application is a Divisional patent application of application Ser. No. 11/239,028, filed on 30 Sep. 2005 now abandoned. The entire disclosure of the prior application Ser. No. 11/239,028, from which an oath or declaration is supplied, is considered a part of the disclosure of the accompanying Divisional application and is hereby incorporated by reference.

BACKGROUND OF THE INVENTION

1. Field of the Invention

The present invention relates to a packaging method of a semiconductor device and a packaging structure thereof, particularly to a packaging method of a light-sensing semiconductor device and a packaging structure thereof, which can protect a light-sensing chip from the pollution by external particles.

2. Description of the Related Art

In a light-sensing semiconductor, the light-sensing region of the light-sensing chip is used to acquire images; thus, the quality of the light-sensing semiconductor correlates closely with the light-sensing chip. During the packaging process of the light-sensing chip, the chip is often polluted by particles; therefore, packaging is a critical process for the quality of the light-sensing semiconductor.

Refer to FIG. 1A and FIG. 1B section views schematically showing the steps of the conventional packaging method of a light-sensing semiconductor device. A light-sensing wafer 10 has multiple light-sensing chips 12, and each light-sensing chip 12 has a light-sensing region 14. A light transparent cover 16 has a matrix of spacer walls 18; an adhesive 20 is applied to between the spacer walls 18, as shown in FIG. 1A. Then, the light transparent cover 16 is flipped and put onto the light-sensing wafer 10, as shown in FIG. 1B. Thus, the light-sensing region 14, the spacer walls 18 and the light transparent cover 16 enclose an airtight space, which can protect the light-sensing region 14 of the light-sensing chip 12 from the pollution by external particles.

As the adhesive 20 has been applied to the light transparent cover 16 when the light transparent cover 16 is being flipped to put onto the light-sensing wafer 10, the adhesive 20 may drops onto the light-sensing region 14 of the light-sensing chip 12, which pollutes the light-sensing region 14 and influences the quality and yield. Further, as the light transparent cover 16 is flipped and then aligned to join with the light-sensing wafer 10, this conventional packaging method has the problem of alignment accuracy. Furthermore, during the press-joining step, if the adhesive is applied too much, the adhesive will overflow into the light-sensing region 14 and pollute the light-sensing chips 12. If the adhesive is applied too little, the sealing effect is poor.

Accordingly, the present invention proposes a packaging method of a semiconductor device and a packaging structure thereof to protect the light-sensing chip from the pollution by external particles.

SUMMARY OF THE INVENTION

The primary objective of the present invention is to provide a packaging method of a light-sensing semiconductor device and a packaging structure thereof, which can prevent the adhesive from dropping onto the light-sensing region during the fabrication process lest the light-sensing chip be polluted and so that the yield and quality of the light-sensing semiconductor can be promoted.

Another objective of the present invention is to provide a packaging method of a light-sensing semiconductor device and a packaging structure thereof, which provides an easy alignment method for the joining step to simplify the fabrication process and promote the alignment accuracy so that the inferior alignment between the light transparent cover and the wafer occurring in the conventional technology will be solved.

Further objective of the present invention is to provide a CSP (Chip Scale Package) packaging method of a light-sensing semiconductor device and a packaging structure thereof.

To achieve the abovementioned objectives, the packaging method of a light-sensing semiconductor device of the present invention comprises: providing a light-sensing wafer, wherein the wafer has multiple light-sensing chips, and each light-sensing chip has a light-sensing region and a non-light-sensing region; forming a buffer layer on the light-sensing wafer; removing a portion of the buffer layer to respectively form a spacer wall on the non-light-sensing region of each light-sensing chip; applying an adhesive to between the spacer walls; and affixing a light transparent cover to the spacer walls on the light-sensing wafer. Thereby, a airtight space, which is enclosed by the light-sensing region, the spacer walls and the light transparent cover, is formed, and it can protects the light-sensing region from the pollution by external particles.

The present invention also proposes a packaging structure of a light-sensing semiconductor device, which is fabricated according to the above-mentioned packaging method and comprises: a light-sensing wafer, having multiple light-sensing chips, wherein each light-sensing chip has a light-sensing region and a non-light-sensing region; multiple spacer walls, respectively formed on the non-light-sensing regions, which encircle the light-sensing chips separately; an adhesive, disposed between two neighboring spacer walls on the non-light-sensing regions; and at least one light transparent cover, affixed to the spacer walls with the adhesive, and covering the light-sensing regions.

To enable the objectives, technical contents, characteristics, and accomplishments of the present invention to be more easily understood, the embodiments of the present invention is to be described below in detail in cooperation with the attached drawings.

BRIEF DESCRIPTION OF THE DRAWINGS

FIG. 1A and FIG. 1B are section views schematically showing the steps of the conventional packaging method of a light-sensing semiconductor device.

FIG. 3A to FIG. 3D are section views schematically showing the steps of the packaging method according to one embodiment of the present invention.

DETAILED DESCRIPTION OF THE INVENTION

The present invention is a packaging method of a light-sensing semiconductor device and a packaging structure thereof, which provides a mechanism by which light can access the light-sensing chip inside the light-sensing semiconductor device and protects the light-sensing chip from the pollution by external particles.

Figure 2:
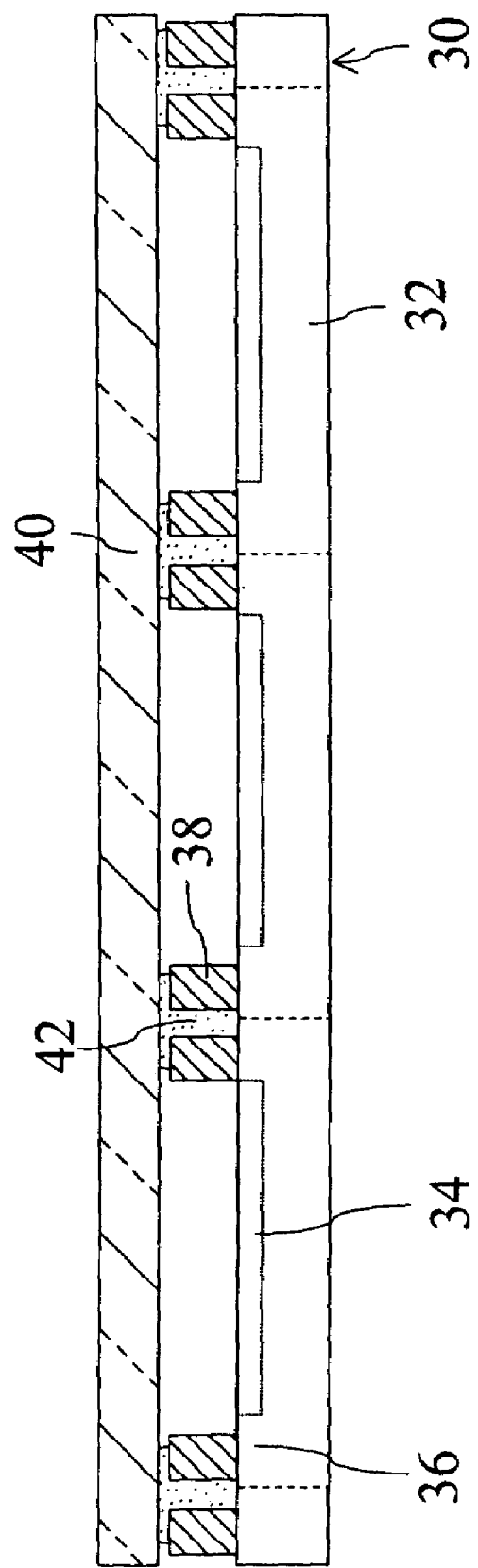
FIG. 2 is a section view schematically showing the packaging structure of a light-sensing semiconductor device according to the present invention.

Refer to FIG. 2 a diagram schematically showing the packaging structure of a light-sensing semiconductor device according to the present invention. This wafer-scale packaging structure of a light-sensing semiconductor device according to the present invention comprises: a light-sensing wafer 30, having multiple light-sensing chips 32, with each light-sensing chip 32 having a light-sensing region 34 and a non-light-sensing region 36; spacer walls 38, separately encircling the non-light-sensing regions 36 of the light-sensing chips 32; and a light transparent cover 40, affixed to the spacer walls 38 with an adhesive 42, such as a thermosetting glue or a UV glue, and covering the light-sensing regions 34, wherein the light transparent cover 40, the spacer walls 38 and the light-sensing regions 34 together form multiple airtight spaces. In the present invention, one identical light transparent cover 40 may cover either multiple light-sensing chips 32, as shown in FIG. 2, or only one light-sensing chip 32.

The abovementioned light transparent cover 40 may also be designed to filter out a light of a specific wavelength, such as a far-infrared ray.

Refer to from FIG. 3A to FIG. 3D for the packaging method of the present invention, which realizes the abovementioned packaging structure. Firstly, as shown in FIG. 3A, a light-sensing wafer 30 is provided, and the light-sensing wafer 30 has multiple light-sensing chips 32, and each light-sensing chip 32 has a light-sensing region 34 and a non-light-sensing region 36. A buffer layer 44 is formed on the light-sensing wafer 30, and the buffer layer may be made of a photoresist material.

Next, as shown in FIG. 3B, a portion of the buffer layer 44 is removed via an etching method, and the remaining buffer layer 44 forms a matrix of spacer walls 38, i.e. every non-light-sensing region 36, which is along the perimeter of each light-sensing chip 32, has a spacer wall 38.

Next, as shown in FIG. 3C, an adhesive 42 is applied to between two neighboring spacer walls 38 that are respectively on two neighboring non-light-sensing regions 36. Next, as shown in FIG. 3D, a light transparent cover 40 is affixed to those spacer walls 38 on the light-sensing wafer 30, and thus, the light-sensing regions 32, the spacer walls 38 and the light transparent cover 40 can form multiple airtight spaces to protect the light-sensing regions 34 of the light-sensing chips 32 from the pollution by external particles. Then, the packaging process is completed.

The light transparent cover 40 may also be affixed to the spacer walls 38 in a vacuum chamber, and airtight and evacuated spaces without residual gas are thus formed lest the thermal expansion of the residual gas influence the reliability of the sealed semiconductor devices during the succeeding high-temperature process.

The abovementioned light-sensing wafer 30 may also be cut by the light-sensing chip 32 in order to form multiple light-sensing semiconductor devices, wherein each light-sensing semiconductor device comprises: a light-sensing chip 32, a spacer wall 38, a light transparent cover 40 and an adhesive 42, which seals the aforementioned parts.

In the present invention, as the adhesive is directly applied to between two neighboring spacer walls on the non-light-sensing region, neither the problem of alignment accuracy nor the problem of the adhesive's dropping onto the light-sensing region will occur. Further, when the light transparent cover is pressed to join with the spacer walls, the adhesive is unlikely to overflow into the light-sensing regions.

Figure 4A:
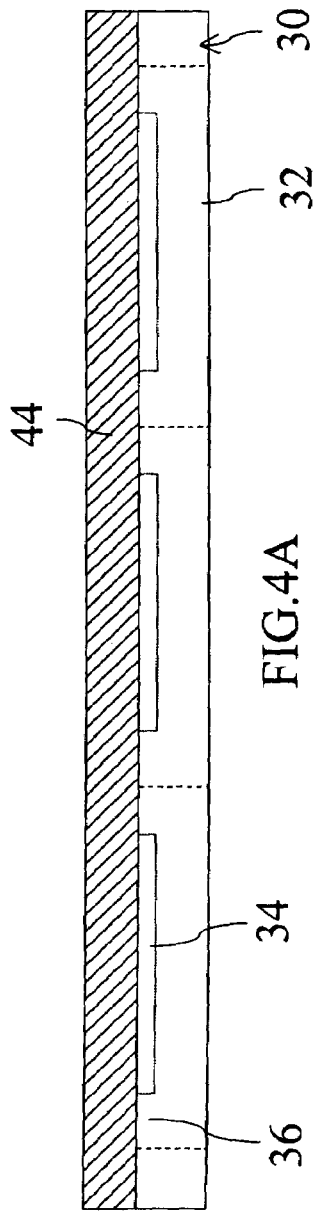
FIG. 4A to FIG. 4E are section views schematically showing the steps of the packaging method according to another embodiment of the present invention.
Figure 4B:
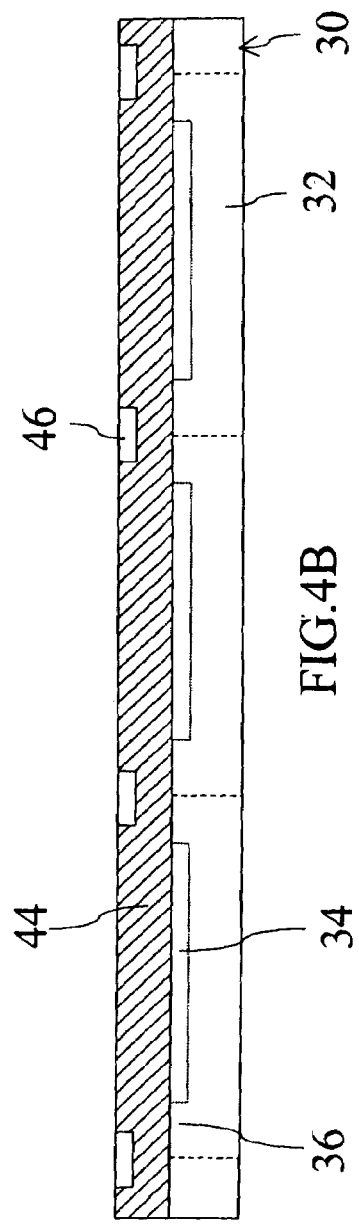
Figure 4C:
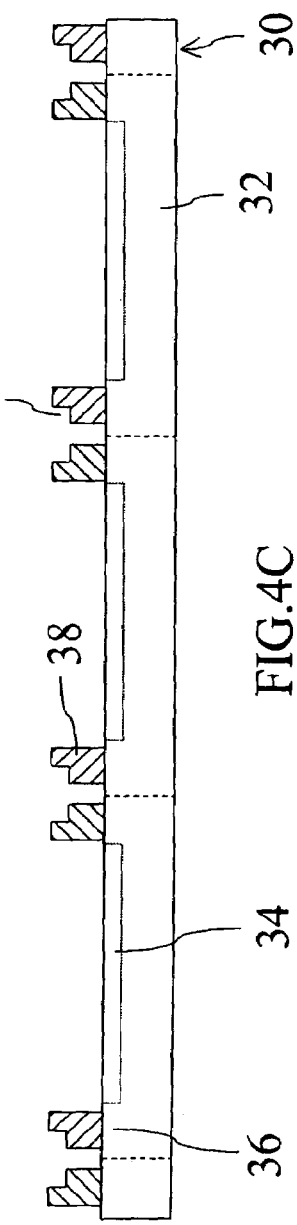
Figure 4D:
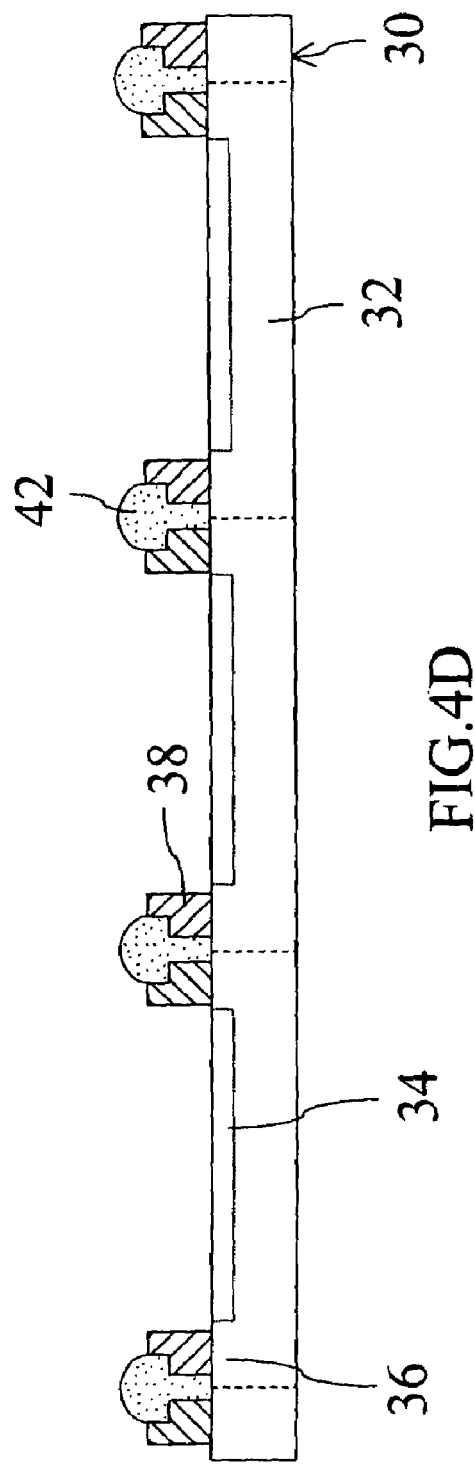
Figure 4E:
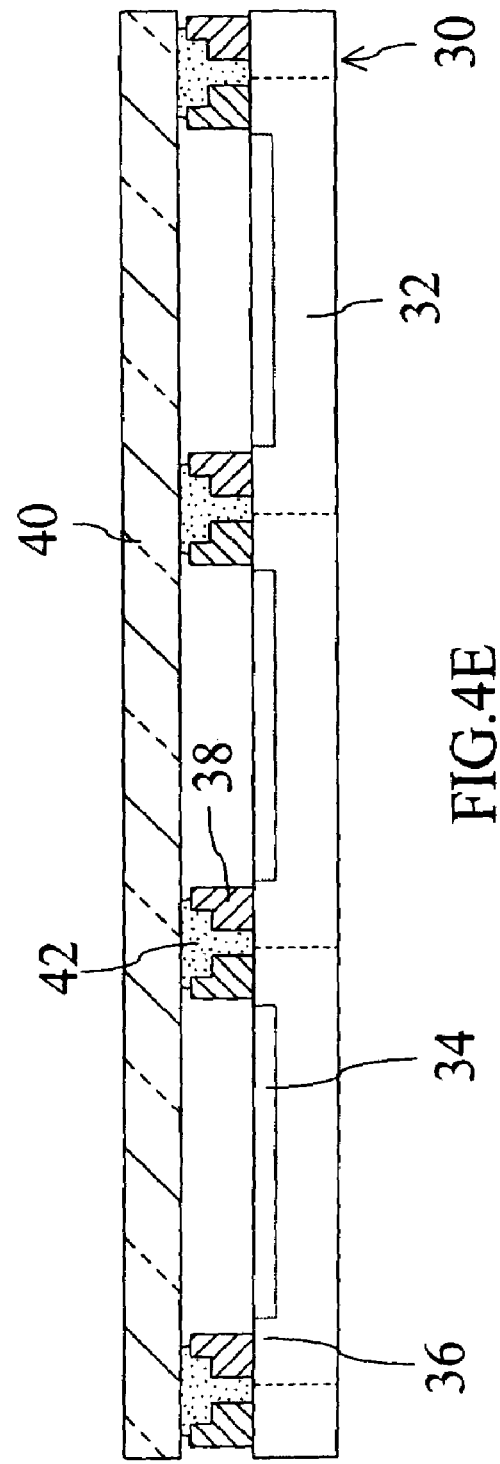

To obtain a better cohering effect of the adhesive, the present invention further proposes another embodiment, which is shown in from FIG. 4A to FIG. 4E. As shown in FIG. 4B, trenches 46 are formed on the buffer layer 44, which has been formed on the light-sensing wafer 30 and is shown in FIG. 4A. Next, as shown in FIG. 4C, a portion of the buffer layer 44 is removed in order to form the spacer walls 38, wherein the tops of every two neighboring spacer walls 38 has one trench 46. Then, as shown in FIG. 4D, those trenches 46 function as the glue-leading channels where the applied adhesive 42 will gather, and the adhesive 42 is unlikely to flow out the matrix formed by those non-light-sensing regions 36. Therefore, as shown in FIG. 4E, when the light transparent cover 40 is pressed to join with to the spacer walls 38, the trenches 46 can prevent the adhesive 42 from overflowing onto the light-sensing region 34.

In summary, the present invention not only can obviously simplify the fabrication process but also can prevent the adhesive from dropping onto the light-sensing regions and polluting the light-sensing chips; thus, the quality and yield of the light-sensing semiconductor devices can be promoted. Further, the present invention also provides a CSP (Chip Scale Package) packaging method of a light-sensing semiconductor device and a packaging structure thereof.

Those embodiments disclosed above are only to clarify the present invention to enable the persons skilled in the art to understand, make and use the present invention; however, those are not intended to limit the scope of the present invention. Any equivalent modification and variation according to the spirit of the present invention disclosed herein is to be included within the scope of the present invention.

The invention claimed is:

1. A packaging method of a light-sensing semiconductor device, comprising the steps of:

providing a light-sensing wafer having multiple light-sensing chips, wherein each said light-sensing chip has a light-sensing region and a non-light-sensing region positioned along a perimeter of said each light-sensing chip;

forming a buffer layer of a predetermined thickness on said light-sensing wafer;

etching a plurality of trenches in said buffer layer substantially in alignment with said non-light-sensing regions of neighboring light-sensing chips, each trench having a bottom of predetermined dimensions positioned at a predetermined depth, said depth being smaller than said predetermined thickness of said buffer layer;

removing portions of said buffer layer above said light-sensing regions through the entire said predetermined thickness thereof, and removing respective portions of said buffer layer between said bottom of said each trench and said light-sensing wafer to form channels of cross-sectional dimensions smaller than said predetermined dimensions of said bottom of said each trench, thereby forming a plurality of pairs of spacer walls on a respective areas corresponding to non-light sensing regions of neighboring light-sensing chips, in each pair thereof, said spacer walls being separated by respective one of said channels, wherein said each pair of spacer walls has a common one of said plurality of trenches positioned at tops of said pair of spacer walls, and wherein said common trench defines a receiving cavity at the tops of said spacer walls in each said pair thereof;

applying an adhesive in said receiving cavity at the tops of said spacer walls; and affixing a light transparent cover to said tops of said spacer walls via said adhesive, wherein at least one of said light-sensing regions, said space walls and said light transparent cover form at least one airtight space, and wherein said adhesive is substantially localized within said receiving cavity and said channel between said spacer walls in each said pair thereof.

2. The packaging method of a light-sensing semiconductor device according to claim 1, wherein said step of removing a portion of said buffer layer is implemented with an etching method.

3. The packaging method of a light-sensing semiconductor device according to claim 1, wherein said step of affixing a light transparent cover to said spacer walls is undertaken in a vacuum chamber, and wherein said light-sensing regions, said spacer walls and said light transparent cover form at least one evacuated and airtight space.

4. The packaging method of a light-sensing semiconductor device according to claim 1, further comprising a cutting step, wherein said light-sensing wafer is divided into a plurality of said light-sensing chips, thereby forming multiple light-sensing semiconductor devices.

* * * * *